(12) United States Patent
Lianto et al.

(10) Patent No.: US 12,020,992 B2
(45) Date of Patent: Jun. 25, 2024

(54) METHODS AND APPARATUS FOR PROCESSING A SUBSTRATE

(71) Applicants: Applied Materials, Inc., Santa Clara, CA (US); NATIONAL UNIVERSITY OF SINGAPORE, Singapore (SG)

(72) Inventors: Prayudi Lianto, Singapore (SG); Guan Huei See, Singapore (SG); Arvind Sundarrajan, Singapore (SG); Muhammad Avicenna Naradipa, Singapore (SG); Andrivo Rusydi, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 206 days.

(21) Appl. No.: 17/584,669

(22) Filed: Jan. 26, 2022

(65) Prior Publication Data

US 2023/0238287 A1 Jul. 27, 2023

(51) Int. Cl.
*H01L 21/66* (2006.01)
*G01N 13/00* (2006.01)
*H01L 23/00* (2006.01)

(52) U.S. Cl.
CPC ............ *H01L 22/12* (2013.01); *G01N 13/00* (2013.01); *H01L 24/80* (2013.01); *H01L 2224/80895* (2013.01); *H01L 2224/80896* (2013.01)

(58) Field of Classification Search
CPC ............ H01L 22/12; H01L 24/80; H01L 2224/80895; H01L 2224/80896; G01N 13/00

USPC ............................................. 356/445
See application file for complete search history.

(56) References Cited

U.S. PATENT DOCUMENTS

| | | |
|---|---|---|
| 6,462,817 B1 | 10/2002 | Strocchia Rivera |
| 6,694,284 B1 | 2/2004 | Nikoonahad et al. |
| 6,872,428 B2 | 3/2005 | Yang et al. |
| 7,158,221 B2 | 1/2007 | Davis et al. |
| 7,414,721 B1 | 8/2008 | Suvkhanov et al. |
| 7,561,282 B1 | 7/2009 | Widmann |
| 7,585,686 B2 | 9/2009 | Verhaverbeke et al. |

(Continued)

OTHER PUBLICATIONS

International Search Report for PCT/US2022/051950, dated Apr. 20, 2023.

*Primary Examiner* — Mohamed K Amara
*Assistant Examiner* — Omar H Nixon
(74) *Attorney, Agent, or Firm* — MOSER TABOA

(57) ABSTRACT

Methods and apparatus for processing a first substrate and a second substrate are provided herein. For example, a method of processing a substrate using extended spectroscopic ellipsometry (ESE) includes directing a beam from an extended spectroscopic ellipsometer toward a first surface of a first substrate and a second surface of a second substrate, which is different than the first substrate, determining in-situ ESE data from each of the first surface and the second surface during processing of the first substrate and the second substrate, measuring a change of phase and amplitude in determined in-situ ESE data, and determining one or more parameters of the first surface of the first substrate and the second surface of the second substrate using simultaneously complex dielectric function, optical conductivity, and electronic correlations from the measured change of phase and amplitude in the in-situ ESE data.

20 Claims, 3 Drawing Sheets

(56) References Cited

U.S. PATENT DOCUMENTS

| | | | |
|---|---|---|---|
| 7,759,254 B2 | 7/2010 | Sasaki et al. | |
| 7,985,188 B2 | 7/2011 | Felts et al. | |
| 9,572,526 B2 | 2/2017 | Felts et al. | |
| 10,201,660 B2 | 2/2019 | Weikart et al. | |
| 10,312,217 B2 | 6/2019 | Tong et al. | |
| 2001/0032704 A1* | 10/2001 | Tesauro | H01L 21/67115 |
| | | | 156/345.31 |
| 2002/0032534 A1* | 3/2002 | Regier | G01N 27/221 |
| | | | 702/57 |
| 2007/0004220 A1* | 1/2007 | Tran Quoc | C23C 16/4405 |
| | | | 438/758 |
| 2007/0213954 A1 | 9/2007 | Price | |
| 2016/0069792 A1* | 3/2016 | O'Mullane | G01N 21/956 |
| | | | 257/48 |
| 2016/0322328 A1* | 11/2016 | Tong | H01L 21/322 |
| 2019/0242938 A1* | 8/2019 | Dai | H01L 21/28202 |
| 2019/0295905 A1* | 9/2019 | Clark | H01L 21/67184 |
| 2020/0388548 A1 | 12/2020 | Horikiri | |

* cited by examiner

METHODS AND APPARATUS FOR PROCESSING A SUBSTRATE

FIELD

Embodiments of the disclosure generally relate to methods and apparatuses for processing substrates. More particularly, embodiments of the disclosure relate to surface/interface characterization in semiconductor substrate process.

BACKGROUND

Substrate (wafer) fabrication can include one or more processes. For example, substrate fabrication can include using one or more deposition processes (e.g., physical vapor deposition (PVD), chemical vapor deposition (CVD), atomic layer deposition (ALD), etc.), one or more bonding processes, one or more cleaning processes, one or more etch processes (e.g., wet etch, dry etch, etc.), and one or more polishing processes (e.g., chemical mechanical polishing (CMP) or other suitable polishing processes). Conventional methods and apparatus are configured for surface/interface characterization to detect cleanliness of a surface of interest. Such methods and apparatus, however, are, typically, configured to perform surface/interface characterization at an end (completion) of each process, which can be highly destructive to the surface of interest.

SUMMARY

Methods and apparatus for processing a substrate are provided herein. In some embodiments, a method for processing a substrate includes directing a beam from an extended spectroscopic ellipsometer toward a first surface of a first substrate and a second surface of a second substrate, which is different than the first substrate, determining in-situ ESE data from each of the first surface and the second surface during processing of the first substrate and the second substrate, measuring a change of phase and amplitude in determined in-situ ESE data, and determining one or more parameters of the first surface of the first substrate and the second surface of the second substrate using simultaneously complex dielectric function, optical conductivity, and electronic correlations from the measured change of phase and amplitude in the in-situ ESE data.

In accordance with at least some embodiments, a non-transitory computer readable storage medium has stored thereon instructions that when executed by a processor perform a method for processing a substrate using extended spectroscopic ellipsometry (ESE). The method for processing a substrate includes directing a beam from an extended spectroscopic ellipsometer toward a first surface of a first substrate and a second surface of a second substrate, which is different than the first substrate, determining in-situ ESE data from each of the first surface and the second surface during processing of the first substrate and the second substrate, measuring a change of phase and amplitude in determined in-situ ESE data, and determining one or more parameters of the first surface of the first substrate and the second surface of the second substrate using simultaneously complex dielectric function, optical conductivity, and electronic correlations from the measured change of phase and amplitude in the in-situ ESE data.

In accordance with at least some embodiments, an apparatus for processing a substrate includes a processing platform for processing a substrate and an extended spectroscopic ellipsometer operably coupled to the processing platform and configured to direct a beam from an extended spectroscopic ellipsometer toward a first surface of a first substrate and a second surface of a second substrate, which is different than the first substrate, determine in-situ ESE data from each of the first surface and the second surface during processing of the first substrate and the second substrate, measure a change of phase and amplitude in determined in-situ ESE data, and determine one or more parameters of the first surface of the first substrate and the second surface of the second substrate using simultaneously complex dielectric function, optical conductivity, and electronic correlations from the measured change of phase and amplitude in the in-situ ESE data.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
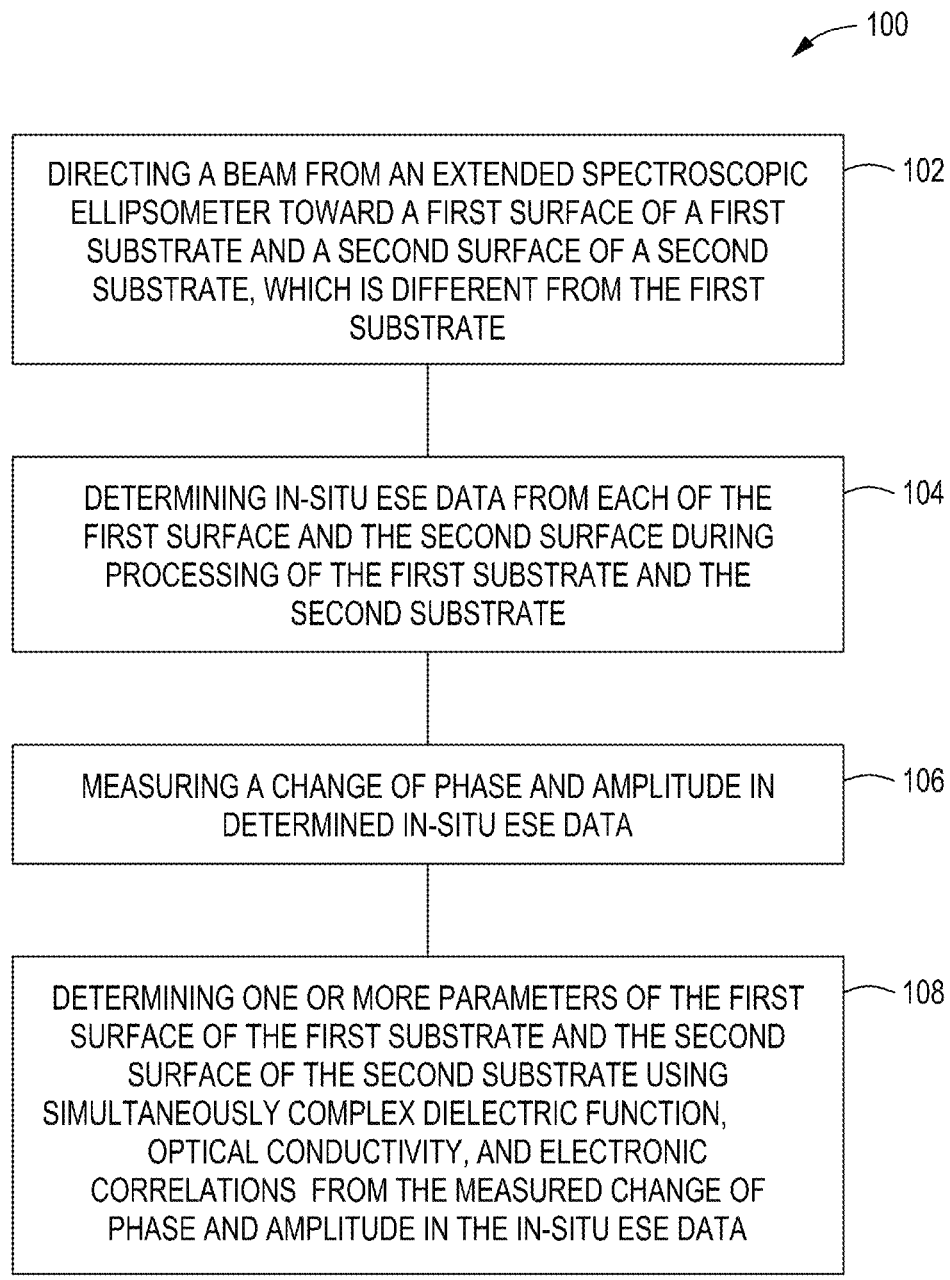
FIG. 1 is a flowchart of a method of processing a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus are provided herein. For example, methods and apparatus of the disclosure are directed to surface/interface characterization in semiconductor substrate processes. For example, in at least some embodiments, methods and apparatus described herein are configured to perform extended spectroscopic ellipsometry (ESE) in real-time during one or more substrate fabrication processes, such as PVD, CVD, cleaning, wet/dry etching, polishing processes (e.g., chemical mechanical polishing process), bonding (e.g., hybrid bonding), etc. For example, the methods and apparatus described herein can provide real-time measurements of surface/interface cleanliness using simultaneously complex dielectric function, optical conductivity, and electronic correlations measured by ESE. The complex dielectric function, optical conductivity, and electronic correlations can be used to probe various surface states relevant to hybrid bonding, e.g., presence of contaminants, contact angle from about 0 to 70°, bonding states such as —OH, —ON, material composition such as SiCN from about 10% to about 30%. As the methods and apparatus described herein use ESE to monitor one or more surfaces of interest in real-time during one or more of the above-described substrate fabrication processes, as opposed to at the end of the substrate fabrication processes, destruction to the surfaces of interest is greatly reduced, if not eliminated.

Figure 2:
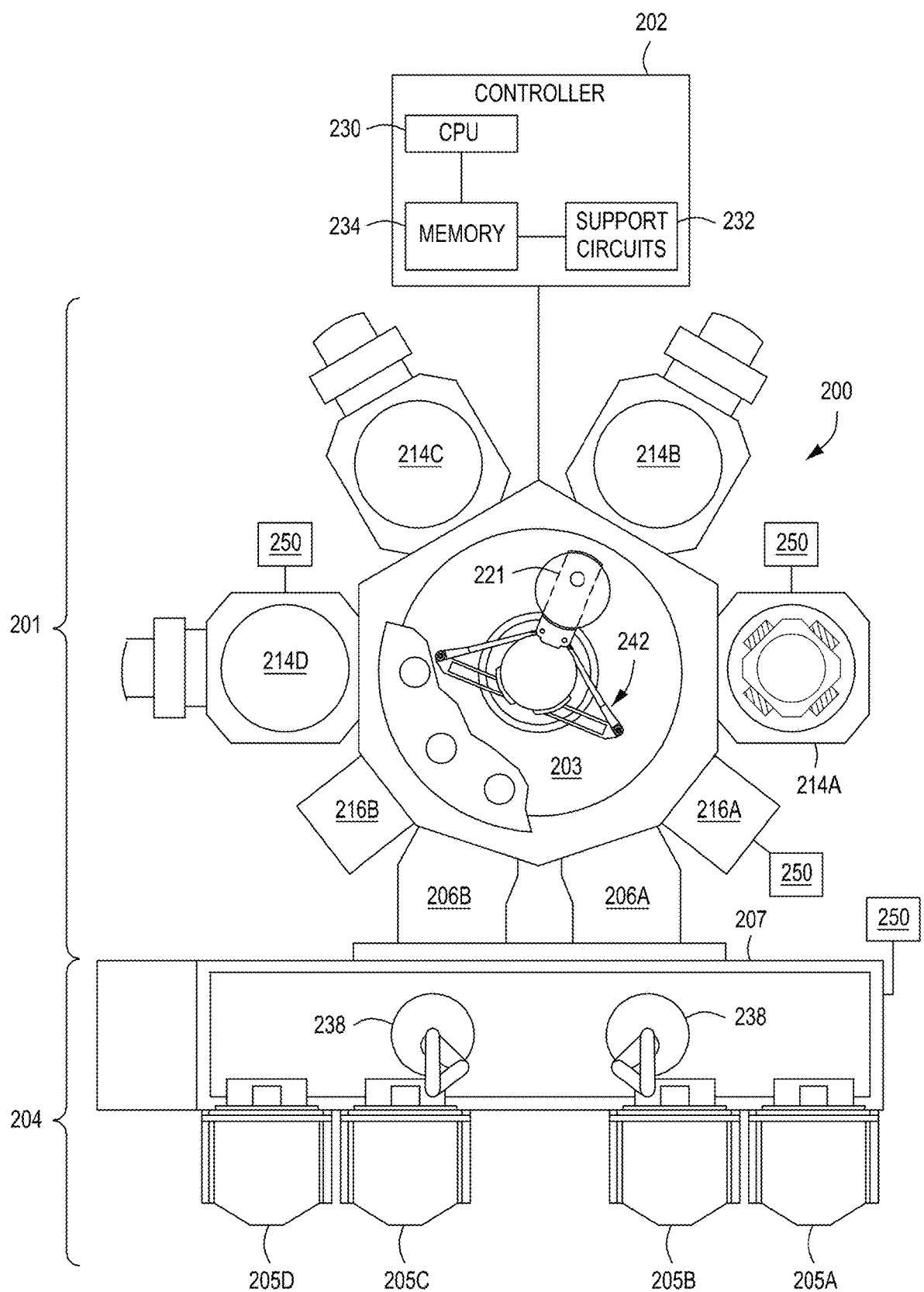
FIG. 2 is a diagram of an apparatus in accordance with at least some embodiments of the present disclosure.

FIG. 1 is a flowchart of a method 100 for processing a substrate, and FIG. 2 is a tool 200 (or apparatus) that can be used for carrying out the method 100, in accordance with at least some embodiments of the present disclosure.

The method 100 may be performed in the tool 200 including any suitable process chambers configured for one or more of physical vapor deposition (PVD), chemical vapor deposition (CVD), such as plasma-enhanced CVD (PECVD) and/or atomic layer deposition (ALD), such as plasma-enhanced ALD (PEALD) or thermal ALD (e.g., no plasma formation), pre-clean chambers, wet etch of dry etch chambers, bonding (e.g., hybrid bonding or other bonding processes) or CMP chambers. Exemplary processing systems that may be used to perform the inventive methods disclosed herein are commercially available from Applied Materials, Inc., of Santa Clara, California Other process chambers, including those from other manufacturers, may also be suitably used in connection with the teachings provided herein.

The tool 200 can be embodied in individual process chambers that may be provided in a standalone configuration or as part of a cluster tool, for example, an integrated described below with respect to FIG. 2. Examples of the integrated tool are available from Applied Materials, Inc., of Santa Clara, California. The methods described herein may be practiced using other cluster tools having suitable process chambers coupled thereto, or in other suitable process chambers. For example, in some embodiments, the inventive methods may be performed in an integrated tool such that there are limited or no vacuum/time breaks between processing steps. For example, reduced vacuum/time breaks may limit or prevent contamination, oxidation, or change of surface termination of the relevant bonding materials (such as oxide, nitride, silicon carbon nitride (SiCN), copper (Cu)).

The integrated tool includes a processing platform 201 (vacuum-tight processing platform), a factory interface 204, and a controller 202. The processing platform 201 comprises multiple process chambers, such as process chambers 214A, 214B, 214C, and 214D operatively coupled to a transfer chamber 203 (vacuum substrate transfer chamber). The factory interface 204 is operatively coupled to the transfer chamber 203 by one or more load lock chambers (two load lock chambers, such as load lock chambers 206A and 206B shown in FIG. 2).

In some embodiments, the factory interface 204 comprises a docking station 207, a factory interface robot 238 to facilitate the transfer of one or more semiconductor substrates (wafers or tape frames). The docking station 207 is configured to accept one or more front opening unified pod (FOUP) or tape frame cassettes. Four FOUPS, such as FOUPS 205A, 205B, 205C, and 205D are shown in the embodiment of FIG. 2. The factory interface robot 238 is configured to transfer the substrates from the factory interface 204 to the processing platform 201 through the load lock chambers, such as load lock chambers 206A and 206B. Each of the load lock chambers 206A and 206B have a first port coupled to the factory interface 204 and a second port coupled to the transfer chamber 203. The load lock chambers 206A and 206B are coupled to a pressure control system (not shown) which pumps down and vents the load lock chambers 206A and 206B to facilitate passing the substrates between the vacuum environment of the transfer chamber 203 and the substantially ambient (e.g., atmospheric) environment of the factory interface 204. The transfer chamber 203 has a vacuum robot 242 disposed within the transfer chamber 203. The vacuum robot 242 is capable of transferring substrates 221 between the load lock chambers 206A and 206B and the process chambers 214A, 214B, 214C, and 214D.

In some embodiments, the process chambers 214A, 214B, 214C, and 214D, are coupled to the transfer chamber 203. The process chambers 214A, 214B, 214C, and 214D comprise at least an ALD chamber, a CVD chamber, a PVD chamber, an e-beam deposition chamber, an electroplating, electroless (EEP) deposition chamber, a pre-clean chamber (e.g., spin clean and dry chamber), a wet etch chamber, a dry etch chamber, a UV chamber, a bonder (pick and flip process) and/or other chamber suitable for performing the methods described herein.

In some embodiments, one or more optional service chambers (shown as 216A and 216B) may be coupled to the transfer chamber 203. The service chambers 216A and 216B may be configured to perform other substrate processes, such as degassing and/or an annealing (e.g., furnace, microwave heating), bonding (pick and flip process), chemical mechanical polishing (CMP), wafer cleaving, etching, plasma dicing, orientation, substrate metrology, cool down and the like.

In at least some embodiments, an extended spectroscopic ellipsometer 250 is operably coupled to the processing platform 201. For example, the extended spectroscopic ellipsometer 250 can be connected to one or more of the process chambers 214A, 214B, 214C, and 214D and/or one or both of the service chambers 216A and 216B. For illustrative purposes, the extended spectroscopic ellipsometer 250 is shown operably connected to the process chambers 214A and 214D and to the service chamber 216A. For example, in at least some embodiments, a swing arm (not shown) of the process chambers 214A, 214B, 214C, and 214D and/or one or both of the service chambers 216A and 216B can be configured to support/house the extended spectroscopic ellipsometer 250 In at least some embodiments, the extended spectroscopic ellipsometer 250 can be connected to the factory interface 204, e.g., for metrology/ inspection.

The extended spectroscopic ellipsometer 250, under control of the controller 202, is configured to perform extended spectroscopic ellipsometry (ESE). For example, in at least some embodiments the extended spectroscopic ellipsometer 250 is configured to direct a beam toward a surface of a substrate for determining in-situ data therefrom during substrate processing. e.g., such as performing one or more of the above-described processes. In at least some embodiments, the extended spectroscopic ellipsometer 250 is configured to measure a change in determined in-situ data and determine various aspects of the surface of the substrate using simultaneously complex dielectric function, optical conductivity, and electronic correlations measured from changes in phase and amplitude of the in-situ extended spectroscopic ellipsometry (ESE) data (in-situ ESE data), as will be described in greater detail below.

The controller 202 controls the operation of the tool 200 using a direct control of the process chambers 214A, 214B, 214C, and 214D or alternatively, by controlling the computers (or controllers) associated with the process chambers 214A, 214B, 214C, and 214D and the tool 200. In operation, the controller 202 enables data collection and feedback from the respective chambers and systems to optimize performance of the tool 200. The controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., non-transitory computer readable storage medium having instructions stored thereon) and, when executed by the central processing unit 230, transform the central processing unit 230 into a controller 202 (specific purpose computer). The software routines may also be stored and/or executed by a second controller (not shown) that is located remotely from the tool 200.

Continuing with reference to FIG. 1, the method 100 uses ESE to characterize surface/interface cleanliness (e.g., endpoint sensing) on one or more surfaces of a substrate. For example, as noted above, the inventors have found that complex dielectric function, optical conductivity, and electronic correlations can be used to probe various surface states relevant to hybrid bonding, e.g., presence of contaminants, contact angle from about 0 to 70°, bonding states such as —OH, —ON, material composition such as SiCN from about 10% to about 30%. The surface states can be directly correlated to downstream reliability performance, such as bonding strength (e.g., from about 0.5 to about 2 J/m$^2$), thus offering a significant advantage from device performance and yield standpoint, e.g., performance and yield can be identified early before completion of a device the substrate, as opposed to the conventional methods of testing performance and yield after assembly (packaging). For example, the controller 202 uses ellipsometry raw data (e.g., $\Psi$ (amplitude) and $\Delta$ (phase)) to extract dielectric function (e.g., $\varepsilon_1$ and $\varepsilon_2$) of material and equations (1)-(3):

$$\rho \equiv \tan \Psi \exp(i\Delta) = r_p/r_s \quad (1)=$$

$$\varepsilon_1 = n^2 - k^2 \quad (2) \text{ and}$$

$$\varepsilon_2 = 2nk \quad (3)$$

With respect to hybrid bonding, the dielectric surface property can be a critical metric to achieve high bonding strength. In ellipsometry, the ratio in amplitude ($\Psi$) and phase difference ($\Delta$) are directly related to the complex dielectric function ($\varepsilon = \varepsilon_1 + i\varepsilon_2$). The direct relationship is apparent in equation (1), where the two ellipsometric parameters ($\Psi$, $\Delta$) are equivalent to the ratio between the p-polarized ($r_p$) and s-polarized reflectance ($r_s$). The reflectance is dependent on the material's refractive index (n) and extinction coefficient (k), where the relation between these two parameters and the complex dielectric function is shown in equation (2) and equation (3).

Initially, one or more substrates may be loaded into one or more of the Four FOUPS 205A, 205B, 205C, and 205D. For example, in at least some embodiments, a top substrate 301 and a bottom substrate 303 can be loaded into the FOUP 205A. The top substrate 301 and the bottom substrate 303 can be made from one or more suitable materials. For example, the top substrate 301 and the bottom substrate 303 can be made from Cu embedded in one of silicon carbon nitride (SiCN) or silicon oxide (SiO$_2$). For example, in at least some embodiments, the top substrate 301 can be a component tape frame wafer made from silicon carbon nitride (SiCN) and the bottom substrate 303 can be made from silicon oxide (SiO$_2$). One or more die 305 (e.g., a plurality of die 305) can be disposed on a top surface of the top substrate 301.

Next, in at least some embodiments, an optional cleaning process can be performed on the top substrate 301 and the bottom substrate 303. For example, in at least some embodiments, the top substrate and the bottom substrate can be transferred from the FOUP 205A through one of the load lock chambers 206A and 206B and to one of the service chambers 216A and 216B (e.g., the service chamber 216A). In at least some embodiments, the method 100 comprises a cleaning process (wet cleaning and spin drying) that comprises performing a wet clean and spin dry process (see 300 of FIG. 3) on the top substrate 301 and the bottom substrate 303. The cleaning process shown at 300 can comprise using at least one of an acid, a base, a solvent, or DI water. For example, when a deep/rough clean of a substrate is required, in at least some embodiments, an acid, a base, and/or a solvent can be used.

Next, an optional degas process (see 302 of FIG. 3) can be performed on one or more substrates. For example, in at least some embodiments, top substrate 301 and the bottom substrate 303 can be transferred from the service chamber 216A to the service chamber 216B. To reduce cost and increase throughput multiple top substrates and bottom substrates can be processed together during the degas process 302.

Next, the top substrate 301 and the bottom substrate 303 can be transferred to the process chamber 214A where one or more plasma and cleaning processes may be performed on the top substrate 301 and the bottom substrate 303. In at least some embodiments, the process chamber 214A can be configured to perform one or more plasma processes and/or cleaning processes (see 304 of FIG. 3) for activation and/or cleaning (e.g., (wet cleaning and spin drying) and of the top substrate 301 and the bottom substrate 303. The cleaning process shown at 304 can comprise using at least one of an acid, a base, a solvent, or DI water. For example, when a gentle/mild clean of a substrate is required, in at least some embodiments, DI water can be used.

Next, at 102 the method 100 comprises, at 102, directing a beam from an extended spectroscopic ellipsometer toward a first surface of a first substrate and a second surface of a second substrate, which is different from the first substrate. For example, 102, under the control of the controller 202, the extended spectroscopic ellipsometer 250 is configured to direct a beam toward the top surface of the top substrate 301 and a top surface of the bottom substrate 303.

Next, at 104, the method 100 comprises determining in-situ ESE data, e.g., a phase ($\Delta$) and amplitude ($\Psi$) of the beam (or reflected beam) from each of the first surface and the second surface during processing of the first substrate and the second substrate. For example, in at least some embodiments, the extended spectroscopic ellipsometer 250 can direct the beam at one or more suitable angles to detect a particular surface state. The beam can be directed at an angle of incidence (incident angle) relative to the top surface of the top substrate 301 and the top surface of the bottom substrate 303 of about 0 to about 80°. For example, in at least some embodiments, the angle of incidence can be about 20° to about 80°. In at least some embodiments, the angle of incidence can be about 45° to about 50°. The photon energy of the beam can be about 0.6 eV to about 10 eV. For example, in at least some embodiments, the photon energy of the beam can be about 3.2 eV to about 6 eV, and in at least some embodiments, can be about 3.3 eV.

Next, the method 100 comprises measuring a change in determined in-situ ESE data. For example, at 106, the method 100 comprises measuring a change of phase and amplitude in determined in-situ ESE data. For example, in at least some embodiments, at 106, the controller 202 can measure a change of a phase (Δ) and amplitude (Ψ) of a reflected beam. For example, under the control of the controller 202, the controller 202 measures a phase and amplitude of the transmitted beam and measures a change of phase and amplitude of the reflected beam detected by the extended spectroscopic ellipsometer 250.

Next, at 108, the method comprises determining one or more parameters of the first surface of the first substrate and the second surface of the second substrate using simultaneously complex dielectric function, optical conductivity, and electronic correlations from the measured change of phase (Δ) and amplitude (Ψ) from the in-situ ESE data. For example, in at least some embodiments, the controller 202 uses complex dielectric function, optical conductivity, and/or electronic correlations, which are obtained from the change of the phase (Δ) and amplitude (Ψ) of the reflected beam to determine presence of contamination, hydrophilicity (contact angle), and various other surface states of the top surface of the top substrate 301 and the top surface of the bottom substrate 303. Electronic correlations, for example, can be used to obtain important information about surface, interface and/or defects, each of which have rich physical properties. For example, for the same dielectric under different surface treatment, electronic correlations are different and yield a unique spectrum of complex dielectric function which can be readily correlated to downstream bonding performance. For instance, the imaginary part of the complex dielectric function, $\varepsilon_2$, is proportional to the optical absorption and optical conductivity of the material. Change in the complex dielectric function, where the real and imaginary part are dependent on each other, may reflect differences in fabrication conditions and/or material performance.

Next, if the controller 202 determines that the surface states (which can be correlated to downstream bonding performance) of either of the top surface of the top substrate 301 and the top surface of the bottom substrate 303 is at a suitable predetermined figure-of-merit (e.g., value), the top substrate 301 and the bottom substrate can be transferred to, for example, one or more of the process chambers 214B-214D and/or the service chambers 216A and 216B for further processing, as described in greater detail below. Conversely, if the controller 202 determines that the surface states on the top surface of the top substrate 301 and the top surface of the bottom substrate 303 is not at a suitable predetermined figure-of-merit, extended processing (e.g., plasma and cleaning processing or another suitable process) can be performed on the top substrate 301 and the bottom substrate 303.

For example, in at least some embodiments, due to the persistence of a contaminant layer, additional processing, e.g., in a pre-clean chamber, may be required to clear the contaminant, and ESE can be used again to monitor the contaminant layer during the pre-clean process until the contaminant layer is fully cleared from the top surface of the top substrate 301 and the top surface of the bottom substrate 303. In such an embodiment, the vacuum robot 242 can transfer the top substrate 301 and the bottom substrate 303 from the process chamber 214A to the process chamber 214D to perform, for example, a pre-clean process, e.g., to remove one or more contaminants described above. Accordingly, once transferred to the process chamber 214D, one or more pre-clean processes can be performed. For example, the pre-cleaning process may be any process suitable to facilitate removal of any material from the top surface of the top substrate 301 and the top surface of the bottom substrate 303 as described above. In at least some embodiments, the top substrate 301 and the bottom substrate 303 may be exposed to a fluorine containing precursor and a hydrogen containing precursor in a two-part dry chemical cleaning process. In some embodiments, the fluorine containing precursor may comprise nitrogen trifluoride (NF3), hydrogen fluoride (HF), diatomic fluorine ($F_2$), monatomic fluorine (F), fluorine-substituted hydrocarbons, combinations thereof, or the like. In some embodiments, the hydrogen containing precursors may comprise atomic hydrogen (H), diatomic hydrogen ($H_2$), ammonia ($NH_3$), hydrocarbons, incompletely halogen-substituted hydrocarbons, combinations thereof, or the like. In some embodiments, O2-based precursor may be used to remove organic contaminants, coupled with reducing (N2/H2-based) precursor to remove Cu oxide which may have formed under the previous O2 treatment.

Figure 3:
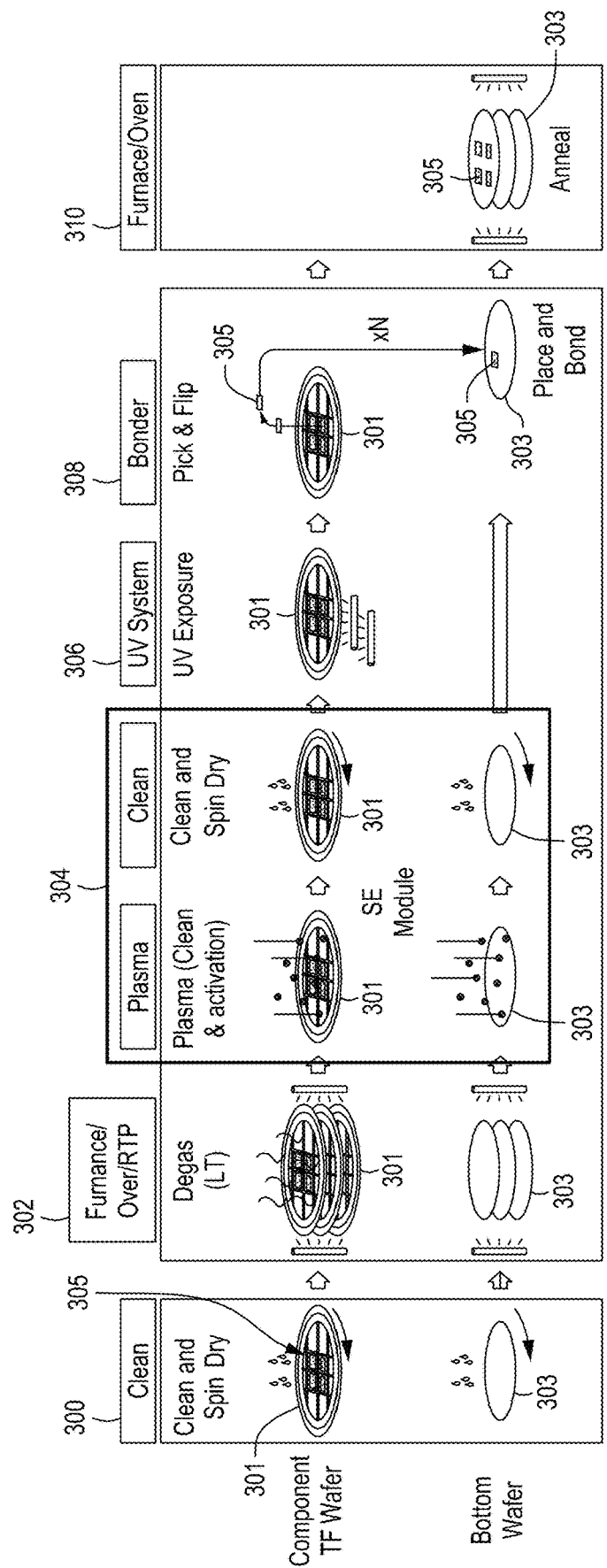
FIG. 3 is a sequencing diagram of the method of FIG. 1 in accordance with at least some embodiments of the present disclosure.

Continuing with reference to FIG. 3, as noted above, if the controller 202 determines that the surface states of either of the top surface of the top substrate 301 and the top surface of the bottom substrate 303 is at a suitable predetermined figure-of-merit, further processing of the top substrate 301 and the bottom substrate 303 can be performed.

For example, in at least some embodiments, the method 100 can comprise performing an ultraviolet process to cure the first substrate after performing the at least one of the plasma process or the cleaning process. In some embodiments, the ultraviolet process can also be performed prior to plasma or cleaning process. For example, an ultraviolet process can be performed on the top substrate (see 306 of FIG. 3). The ultraviolet light can be applied to a bottom surface of the top substrate, but in some embodiments, can be applied to the top surface or both the top and bottom surfaces of the top substrate. In at least some embodiments, the ultraviolet process can be used to also cure the bottom substrate 303 (e.g., similarly to the top substrate 301). The ultraviolet process facilitates with a bonding process, e.g., removing die from a top surface of the top substrate 301.

Next, in at least some embodiments, the method 100 can comprise performing a bonding process after performing the ultraviolet process. For example, the bonding process can comprise picking up a die (e.g., the die 305) from the first surface of the first substrate (e.g., the top surface of the top substrate 301) and disposing the die on the second surface of the second substrate (e.g., the top surface of the bottom substrate 303 substrate. The bonding process can be performed for as many die that are present on the top surface of the top substrate 301.

Next, the method 100 can comprise performing an annealing process after performing the bonding process. For example, after all of the die 305 are placed on the top surface of the bottom surface, an annealing process can be performed to anneal the bottom substrate 303 (see 310 of FIG. 3). The annealing process facilitates affixing the die to the top surface of the bottom substrate 303). As described above, a multiple of bottom substrates can be processed together to reduce costs and increase throughput.

Additionally, the controller 202 can use the extended spectroscopic ellipsometer 250 during any of the processes prior to and/or subsequent of 102-108. For example, the extended spectroscopic ellipsometer 250 can be used as described herein during the cleaning process, the degas process, the bonding process, the ultraviolet process, and/or the annealing process.

While the foregoing is directed to embodiments of the present disclosure, other and further embodiments of the disclosure may be devised without departing from the basic scope thereof.

The invention claimed is:

1. A method of processing a first substrate and a second substrate using extended spectroscopic ellipsometry (ESE), comprising:
   directing a beam from an extended spectroscopic ellipsometer toward a first surface of a first substrate and a second surface of a second substrate, which is different than the first substrate;
   determining in-situ ESE data from each of the first surface and the second surface during processing of the first substrate and the second substrate;
   measuring a change of phase and amplitude in determined in-situ ESE data; and
   determining one or more parameters comprising at least one of a level of contamination or surface bonding states of the first surface of the first substrate and the second surface of the second substrate using simultaneously complex dielectric function, optical conductivity, and electronic correlations from the measured change of phase and amplitude in the in-situ ESE data.

2. The method of claim 1, wherein the in-situ ESE data comprises a change of a phase and an amplitude of a reflected beam.

3. The method of claim 1, wherein the one or more parameters of the first surface of the first substrate and second surface of the second substrate further comprises at least one of a contact angle or material composition.

4. The method of claim 1, wherein directing the beam comprises directing the beam toward the first surface of the first substrate and the second surface of the second substrate at an incident angle of about 20° to about 80°.

5. The method of claim 1, wherein directing the beam comprises directing the beam toward the first surface of the first substrate and the second surface of the second substrate at an incident angle of about 45° to about 50°.

6. The method of claim 1, wherein the beam has a photon energy of about 0.6 eV to about 10 eV.

7. The method of claim 1, wherein the beam has a photon energy of about 3.2 eV to about 6 eV.

8. The method of claim 1, wherein the first substrate and the second substrate comprises Cu embedded in one of silicon carbon nitride (SiCN) or silicon oxide ($SiO_2$).

9. The method of claim 1, wherein processing the first substrate and the second substrate comprises performing at least one of a plasma process or a cleaning process that are part of a hybrid bonding process.

10. The method of claim 9, further comprising performing an ultraviolet process to cure the first substrate after performing the at least one of the plasma process or the cleaning process.

11. The method of claim 10, further comprising performing a bonding process after performing the ultraviolet process, wherein the bonding process comprises picking up a die from the first surface of the first substrate and disposing the die on the second surface of the second substrate.

12. The method of claim 11, further comprising performing an annealing process after performing the bonding process.

13. A non-transitory computer readable storage medium having stored thereon instructions that when executed by a processor perform a method for processing a first substrate and a second substrate using extended spectroscopic ellipsometry (ESE), the method comprising:
   directing a beam from an extended spectroscopic ellipsometer toward a first surface of a first substrate and a second surface of a second substrate, which is different than the first substrate;
   determining in-situ ESE data from each of the first surface and the second surface during processing of the first substrate and the second substrate;
   measuring a change of phase and amplitude in determined in-situ ESE data; and
   determining one or more parameters comprising at least one of a level of contamination or surface bonding states of the first surface of the first substrate and the second surface of the second substrate using simultaneously complex dielectric function, optical conductivity, and electronic correlations from the measured change of phase and amplitude in the in-situ ESE data.

14. The non-transitory computer readable storage medium of claim 13, wherein the in-situ ESE data comprises a change of a phase and an amplitude of a reflected beam.

15. The non-transitory computer readable storage medium of claim 13, wherein the one or more parameters of the first surface of the first substrate and second surface of the second substrate further comprises at least one of a contact angle or material composition.

16. The non-transitory computer readable storage medium of claim 13, wherein directing the beam comprises directing the beam toward the first surface of the first substrate and the second surface of the second substrate at an incident angle of about 20° to about 80°.

17. The non-transitory computer readable storage medium of claim 13, wherein directing the beam comprises directing the beam toward the first surface of the first substrate and the second surface of the second substrate at an incident angle of about 45° to about 50°.

18. The non-transitory computer readable storage medium of claim 13, wherein the beam has a photon energy of about 0.6 eV to about 10 eV.

19. The non-transitory computer readable storage medium of claim 13, wherein the beam has a photon energy of about 3.2 eV to about 6 eV.

20. An apparatus for processing a first substrate and a second substrate, comprising:
   a processing platform for processing a plurality of substrates; and
   an extended spectroscopic ellipsometer (ESE) operably coupled to the processing platform and configured to:
      direct a beam from the extended spectroscopic ellipsometer toward a first surface of a first substrate and a second surface of a second substrate, which is different than the first substrate;
      determine in-situ ESE data from each of the first surface and the second surface during processing of the first substrate and the second substrate;
      measure a change of phase and amplitude in determined in-situ ESE data; and
      determine one or more parameters comprising at least one of a level of contamination or surface bonding states of the first surface of the first substrate and the second surface of the second substrate using simultaneously complex dielectric function, optical conductivity, and electronic correlations from the measured change of phase and amplitude in the in-situ ESE data.

* * * * *